United States Patent
Hu et al.

(10) Patent No.: US 9,246,062 B2
(45) Date of Patent: Jan. 26, 2016

(54) ZINC STANNATE OHMIC CONTACTS FOR P-TYPE GALLIUM NITRIDE

(71) Applicant: Intermolecular, Inc., San Jose, CA (US)

(72) Inventors: Jianhua Hu, Palo Alto, CA (US); Heng Kai Hsu, Hisnchu (TW); Tong Ju, Santa Clara, CA (US); Minh Huu Le, San Jose, CA (US); Sandeep Nijhawan, Los Altos, CA (US); Teresa B. Sapirman, Mountain View, CA (US)

(73) Assignee: Intermolecular, Inc., San Jose, CA (US)

( * ) Notice: Subject to any disclaimer, the term of this patent is extended or adjusted under 35 U.S.C. 154(b) by 58 days.

(21) Appl. No.: 14/259,387

(22) Filed: Apr. 23, 2014

(65) Prior Publication Data

US 2015/0311397 A1 Oct. 29, 2015

(51) Int. Cl.
*H01L 21/00* (2006.01)
*H01L 33/42* (2010.01)
*H01L 33/32* (2010.01)

(52) U.S. Cl.
CPC .............. *H01L 33/42* (2013.01); *H01L 33/32* (2013.01); *H01L 2933/0016* (2013.01)

(58) Field of Classification Search
CPC ................................ H01L 33/42; H01L 33/32
See application file for complete search history.

(56) References Cited

U.S. PATENT DOCUMENTS

| 6,169,246 | B1 | 1/2001 | Wu et al. |
| 2009/0267105 | A1 | 10/2009 | Yu et al. |
| 2010/0075177 | A1 | 3/2010 | Lee et al. |
| 2011/0308593 | A1* | 12/2011 | Frey .................. H01L 21/02675 136/256 |
| 2012/0055534 | A1 | 3/2012 | Leschkies et al. |

OTHER PUBLICATIONS

Tan et al.; Zinc Stannate (Zn2SnO4) Dye-Sensitized Solar Cells; Mar. 20, 2007; JACS Communications; Journal of the American Chemical Society, vol. 129, No. 14; American Chemical Society; pp. 4162-4163.

* cited by examiner

*Primary Examiner* — Richard Booth

(57) ABSTRACT

Transparent ohmic contacts to p-GaN and other high-work-function ($\geq 4.2$ eV) semiconductors are fabricated from zinc stannate (e.g., $ZnSnO_3$). ZnO and $SnO_2$ may be sputtered from separate targets and annealed to form the zinc stannate. The Zn:Sn ratio may be tuned over the range between 1:2 and 2:1 to optimize bandgap, work function, conductivity, and transparency for the particular semiconductor and wavelength of interest. Conductivity may be improved by crystallizing the zinc stannate, by doping with up to 5 wt % Al or In, or both.

10 Claims, 5 Drawing Sheets

ZINC STANNATE OHMIC CONTACTS FOR P-TYPE GALLIUM NITRIDE

BACKGROUND

Related fields include transparent conductive thin films, particularly for use with optoelectronic devices including III-V materials, and physical vapor deposition (PVD), particularly sputtering.

A typical LED emits light from an active photoemissive semiconductor layer sandwiched between p-type and n-type semiconductor layers. Electroluminescence results when negative charge carriers (electrons) from the n-type layer and positive charge carriers ("holes") from the p-type layer meet and combine in the active photoemissive layer.

The wavelength and color of the emitted light depends, at least in part, on the semiconductor bandgap. For example, arsenides of aluminum (Al), gallium (Ga), indium (In), and their alloys emit red and infrared light; phosphides of Al, Ga, In, and their alloys emit green, yellow, or red light; and nitrides of Al, Ga, In, and their alloys emit ultraviolet, violet, blue, or green light. These "III-V materials," so-called because they include elements from old group III (now group 13) and old group V (now group 15) of the periodic table, have high carrier mobility and direct bandgaps that are desirable in optoelectronic applications. However, substrates made of III-V materials have historically been very expensive. GaN and AlN substrates are becoming increasingly available, but problems with instability and defects persist. A common alternative approach has been to grow III-V layers by epitaxy on a different substrate material such as sapphire ($Al_2O_3$), silicon (Si), silicon carbide (SiC), germanium (Ge), zinc oxide (ZnO), or glass.

A "junction-up" LED emits its output light in a direction pointing away from the substrate, while an inverted, or "flip-chip," LED emits its output light toward the substrate. Both types may use transparent electrodes on the light-emitting side to facilitate the passage of both electrical current and light through the semiconductor stack. Other devices with similar requirements for current and light traversing the same surface also use transparent electrodes. Many thin-film materials for transparent electrodes are oxides, and are generically known as "transparent conductive oxides" (TCO).

Indium tin oxide, (ITO), the most common TCO material for transparent electrodes, is expensive because it is typically over 90% indium (In). The optical transparency and the conductivity generally need to be traded off against each other because the highest-transparency formulations are generally different from the highest-conductivity formulations. In addition, both the optical transparency and the conductivity may be unstable with temperature, and therefore may change unpredictably during high-temperature process steps, such as annealing, that may be required to fabricate either the TCO itself or other parts of the device.

As with any electrode material, another variable that needs to be optimized is the work function. If a low-loss ohmic contact to a semiconductor is desired, a generally necessary (though not always sufficient) condition is a close match between the electrode work function and the semiconductor work function. High-indium ITO is one of a few TCO materials that can be tuned to match the work function of p-GaN.

Therefore, a need exists for a cost-effective TCO material with a work-function matching that of p-GaN (4.2 eV or greater), exhibiting low absorption coefficient (<0.03%/nm) and low resistivity (contact resistance<0.005 $\Omega\text{-}cm^2$) throughout the temperature range of fabrication processes for LEDs and other optoelectronic devices. Smooth morphology and compatibility with other processes used in making the device are also desirable.

SUMMARY

The following summary presents some concepts in a simplified form as an introduction to the detailed description that follows. It does not necessarily identify key or critical elements and is not intended to reflect a scope of invention.

Some embodiments of optoelectronic devices include a semiconductor layer having a work function of 4.2 eV or greater, such as p-GaN, and an ohmic contact layer comprising zinc stannate ($ZnSnO_3$). In some embodiments, the $ZnSnO_3$ may be more than about 30% crystalline. In some embodiments, the $ZnSnO_3$ may be doped with up to 5 wt % aluminum (Al) or In. The weight ratio of Zn:Sn in the ohmic contact layer may be between about 1:2 and about 2:1. The ohmic contact layer may have a work function of about 5 eV or greater and may have absorption coefficient below 0.03%/nm at wavelengths between about 400 nm and 800 nm. The ohmic contact layer may be between about 20 nm and 200 nm thick.

Some embodiments of methods for forming zinc stannate ohmic contacts to p-GaN (or other semiconductors with similar work functions 4.2 eV) include sputtering. In some embodiments, the sputtering may include reactive co-sputtering from separate Zn and Sn targets in an oxidizing ambient to optimize the combination of bandgap, work function, conductivity, and transparency at operating wavelength(s) for the device being fabricated. In some embodiments, a process parameter (e.g., power, distance from the substrate, angle relative to the substrate) may be varied between the two targets during the co-sputtering to produce a gradient in the Zn:Sn ratio in a direction perpendicular to the substrate surface. The substrate temperature during deposition may be between about 25 C and 500 C. In some embodiments, the deposition may be followed by annealing at 200-650 C for 3-10 min to crystallize the zinc stannate.

Some embodiments of the methods include doping the zinc stannate layer with up to 5 wt % Al or In. The dopant may be incorporated in the zinc-containing target and/or the tin-containing target. Alternatively, the dopant may be sputtered from a separate target. If sputtered from a separate target, the dopant may be co-sputtered with the zinc-containing material and/or the tin-containing material. Alternatively, the dopant may be sputtered as one or more separate layers and thermally interdiffused with the zinc stannate by annealing. As another alternative, the dopant may be added by ion implantation to the fully or partially formed zinc stannate layer, and any resulting structural damage to the layer may be repaired by annealing.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

DETAILED DESCRIPTION OF EXAMPLE EMBODIMENTS

Figure 1A:
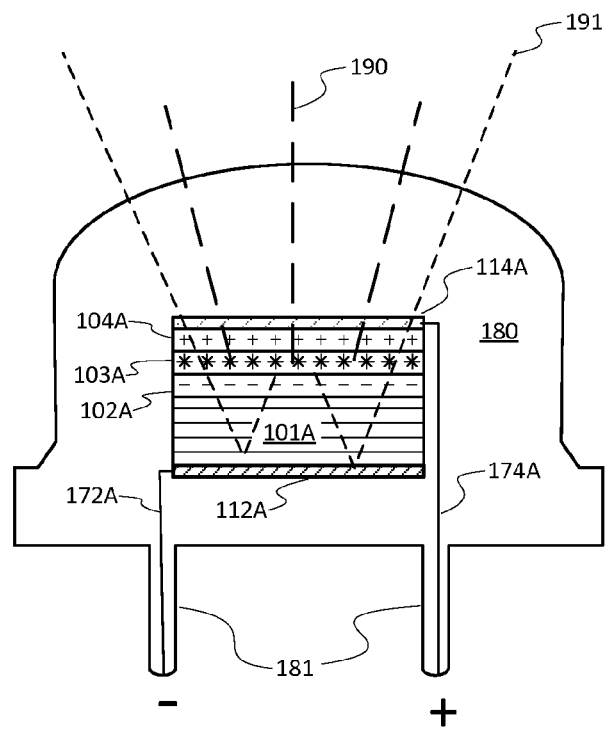
FIGS. 1A and 1B conceptually illustrate examples of LEDs.

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

Unless the text or context clearly dictates otherwise: (1) By default, singular articles "a," "an," and "the" (or the absence of an article) may encompass plural variations; for example, "a layer" may mean "one or more layers." (2) "Or" in a list of multiple items means that any, all, or any combination of less than all the items in the list may be used in the invention. (3) Where a range of values is provided, each intervening value is encompassed within the invention. (4) "About" or "approximately" contemplates up to 10% variation. "Substantially equal," "substantially unchanged" and the like contemplate up to 5% variation.

"Horizontal" defines a plane parallel to the plane or surface of the substrate. "Vertical" shall mean a direction perpendicular to the horizontal. "Above," "below," "bottom," "top," "side" (e.g. sidewall), "higher," "lower," "upper," "over," and "under" are defined with respect to the horizontal plane. "On" indicates direct contact; "above" and "over" allow for intervening elements. "On" and "over" include conformal configurations covering feature walls oriented in any direction.

"Substrate," as used herein, may mean any workpiece on which formation or treatment of material layers is desired. Substrates may include, without limitation, silicon, germanium, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof. The term "substrate" or "wafer" may be used interchangeably herein. Semiconductor wafer shapes and sizes can vary and include commonly used round wafers of 50 mm, 100 mm, 150 mm, 200 mm, 300 mm, or 450 mm in diameter. Furthermore, the substrates may be processed in many configurations such as single substrate processing, multiple substrate batch processing, in-line continuous processing, in-line "stop and soak" processing, or roll-to-roll processing.

As used herein, a material (e.g. a dielectric material or an electrode material) will be considered to be "crystalline" if it exhibits greater than or equal to 30% crystallinity as measured by a technique such as x-ray diffraction (XRD). As used herein, a "dopant" is a minor constituent (generally <20 weight %) of a layer or material that is purposely added. As used herein, the dopant may be electrically active or not electrically active. The definition excludes residues and impurities such as carbon, etc. that may be present in the material due to inefficiencies of the process or impurities in the precursor materials. "Ohmic contact" as used herein shall refer to a contact resistance of less than about 10 μΩ-cm.

Figure 1B:
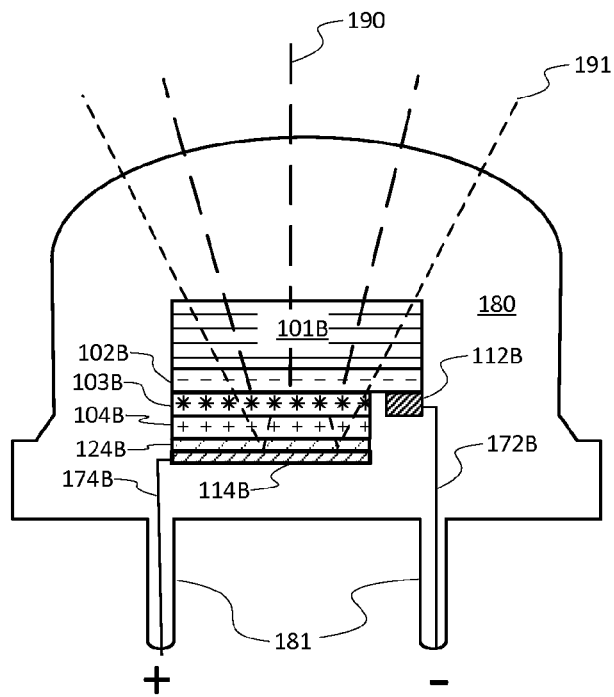

FIGS. 1A and 1B conceptually illustrate examples of LEDs. Many different LED designs exist, and new ones continue to be introduced. These examples are intended to provide basic context and do not limit the scope of application of the described components and methods.

FIG. 1A illustrates an example of a junction-up LED. A "junction-up" LED emits light from the side opposite the substrate, through a transparent or semi-transparent electrode. Inside the transparent envelope of package 180, substrate 101A supports n-type semiconductor layer 102A, active photoemissive layer 103A, and p-type semiconductor layer 104A. Collectively, the n-type, photoemissive, and p-type layers, along with any intervening layers between them, may be referred to as the "active stack." Current delivered through terminal pins 181 is conducted through leads 172A and 174A to negative electrode 112A and positive electrode 114A. Some junction-up LEDs have one electrode on the "top" (the side of the film stack farthest from the substrate) and one on the "bottom" (the side of the film stack nearest the substrate). The current causes negative charge-carriers to migrate from n-type layer 102A into active photoemissive layer 103A, and positive charge-carriers to migrate from p-type layer 104A into active photoemissive layer 103A. When the negative charge-carriers and positive charge-carriers recombine in active photoemissive layer 103A, photons of light are emitted.

Upward-directed light 190 passes through positive-polarity contact 114A, illustrated here as a transparent electrode. In some LEDs, positive-polarity contact 114A is opaque or reflecting, but only covers part of the top surface so that light may emerge from the uncovered parts of the surface. Downward-directed light 191 passes through substrate 101A and is reflected from reflective negative-polarity contact 112A to redirect it upward, where it exits from the top surface.

In some junction-up LEDs, reflective negative-polarity contact 112A is between substrate 101A and n-type layer 102A. These designs do not require substrate 101A to be transparent; it may be an opaque material such as silicon carbide. In some junction-up LEDs, the positive-polarity components are underneath the active photoemissive layer and the negative-polarity components are above it.

FIG. 1B illustrates an example of a flip-chip LED. A flip-chip LED is fabricated to emit its output light toward the substrate. Originally, the film stack is formed on substrate 101B, but when the die is installed in package 180, it is inverted or "flipped" upside-down to position substrate 101B on top. Thus "substrate" 101B becomes a "superstrate." In the illustrated example, superstrate 101B remains as part of the finished device, and therefore preferably transmits the emitted wavelength(s). In some embodiments, superstrate 101B is removed from the finished device, so its transparency is not a constraint. In the illustrated example, part of the surface of n-type semiconductor layer 102B is exposed to allow the attachment of negative-polarity contact 112B, which makes contact only with part of the n-type layer. In some LEDs, this removes or relaxes the requirement that negative-polarity contact 112B have any particular optical properties such as transparency.

When current passes through the device from pins 181 through leads 172B and 174B, light is emitted from active photoemissive layer 103B. Light emitted from active photoemissive layer 103B toward superstrate 101B is transmitted directly out of the device. Light emitted from active photoemissive layer 103B toward p-type layer 104B is reflected from reflective positive-polarity contact 114B, which redirects it upward through superstrate 101B.

Transparent conductive oxide (TCO) materials are used, for example, as top (positive-polarity) electrode 114A in FIG. 1A, forming a contact to p-doped layer 104A. In some embodiments, such as if a material is not available for reflective contact 114B that both forms an ohmic contact to p-type layer 104B and has high reflectivity at the LED's operating wavelength, a TCO layer 124B may be interposed between p-type layer 104B and reflective contact 114B. In that way, the TCO 124B provides the desired electrical properties and the reflective layer 114B provides the desired optical properties.

Zinc stannate (usually as $ZnSnO_3$) has high transparency at visible wavelengths and has been used as an amorphous barrier layer in low-emissivity glass. As such, its compatibility with other thin-film process sequences has been established. Zinc stannate may be deposited at temperatures as low as 25 C, which does not risk changing the properties most other layers. Zinc stannate also can be formulated with a work function greater than 5 eV to match p-GaN and other semiconductors with lower work functions. Being made of earth-abundant materials, zinc stannate is significantly less expensive than ITO. However, the widely-used amorphous phase is not highly conductive, as would be desirable in an ohmic contact material.

Embodiments of zinc stannate transparent conductive layers exhibit higher conductivity than amorphous barriers of similar composition. The conductivity is increased by crystallization, doping, or both. Crystallization may be achieved by depositing at an elevated temperature (~200-500 C), annealing at ~200-650 C after deposition, or both. Dopants may be, for example, up to 5 wt % In or Al. The dopant may be incorporated in a zinc-containing sputter target, a tin-containing sputter target, or a separate metal or metal-oxide target. The dopant may be co-deposited with the zinc stannate, may be deposited in one or more separate layers and diffused through the zinc stannate by annealing, or may be ion-implanted in a separate treatment.

Figure 2:
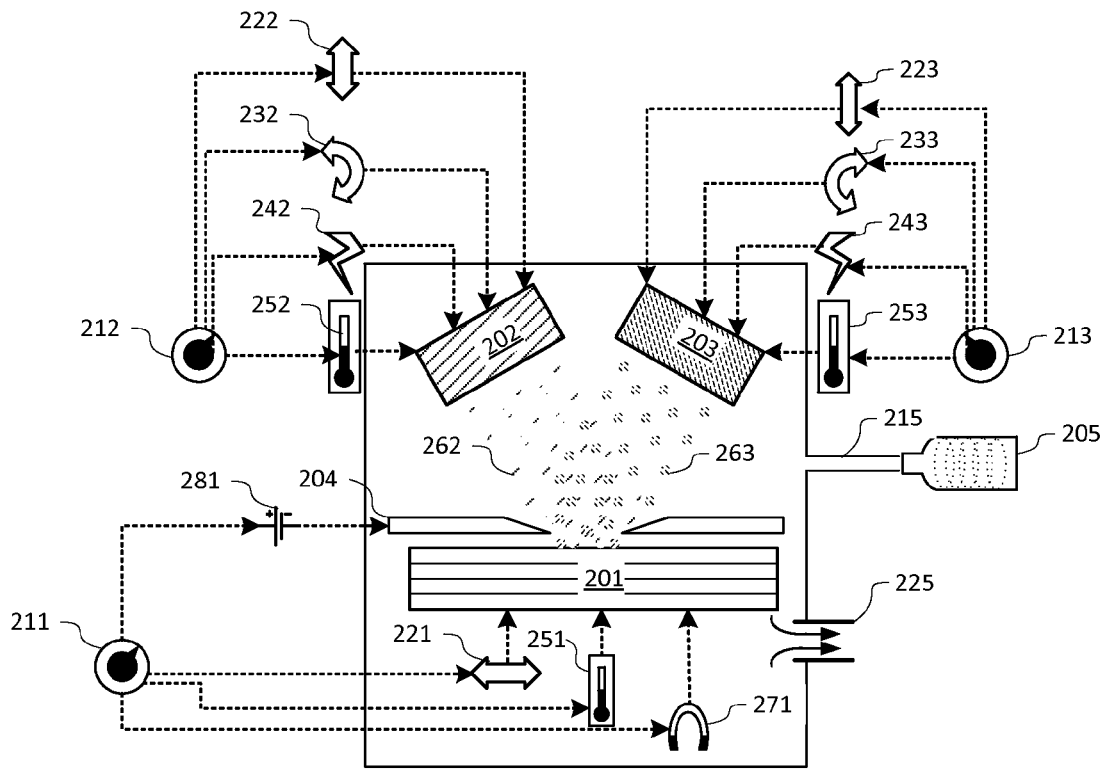
FIG. 2 is a block diagram of an example of a PVD chamber configured for co-sputtering.

FIG. 2 is a block diagram of an example of a PVD chamber configured for co-sputtering. Substrate 201 receives a first sputtered material 262 from a first target 202 and a second sputtered material 263 from a second target 203. A controller 212 may control one or more of position 222, angle 232, plasma power 242, and temperature 252 of target 202. A controller 213 may control one or more of position 223, angle 233, plasma power 243, and temperature 253 of target 203. Although the illustrated system shows two targets for simplicity, some embodiments may use more than two targets.

Controllers 212 and 213 for the separate targets may independently vary the respective targets' position, angle, plasma power, or temperature in real time as sputtering continues. Thus the separate targets can be sputtered at different plasma power levels or temperatures, or from different throw distances to the substrate, to vary the relative concentrations of each target material being deposited on the substrate. If at least one of the variables can be changed while sputtering continues, the composition of the film may be varied with depth if desired. Process gases from one or more gas sources 205 may be injected into the chamber through gas inlet(s) 215, and removed from the chamber, along with process by-products, through one or more vacuum exhaust ports 225.

Some process chambers also have a controller 211 to vary the position 221, temperature 251, and local magnetic field 271 of substrate 201. Like the other controllers 212 and 213, controller 211 may be programmable, may be remote from the process chamber and operate via a wireless connection, and may be capable of varying the substrate's position, angle, plasma power, or temperature in real time as sputtering continues. "Position" in this block diagram is symbolized by a single two-headed arrow for simplicity, but it is intended to symbolize position variation in any or all directions. Some process chambers also have a mask 204 to block sputtered materials 262, 263 from reaching selected parts of substrate 201. Optionally, a controllable bias voltage 281 may be applied to mask 204. In process chambers equipped to change the relative position of substrate 201 and mask 204 during processing, different parts of substrate 201 may be sputtered with material having different proportions of first material 262 and second material 263.

By co-sputtering from separate zinc-containing and tin-containing targets, the relative weight percentages of the two components can be controlled by controlling the power applied to each target. Alternatively, the sputtering distance or angle of each sputter gun relative to the substrate may be varied. In some embodiments, one or more of these parameters may be varied during the deposition to produce a depth-wise (i.e., perpendicular to the substrate surface) composition gradient. Dopants may be sputtered from additional targets, incorporated into the zinc-containing and tin-containing targets, or ion-implanted in a separate process.

Figure 3:
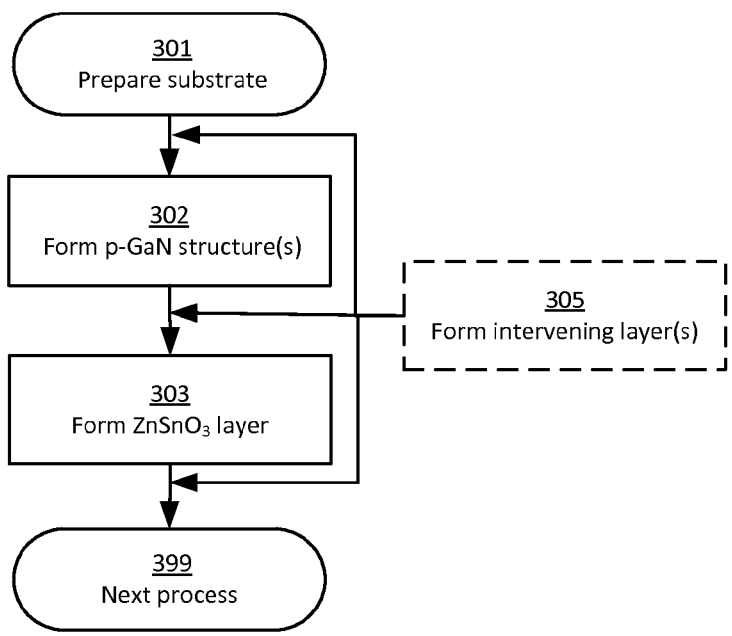
FIG. 3 is a flowchart of an example process for forming a zinc stannate ohmic contact to p-GaN.

FIG. 3 is a flowchart of an example process for forming a zinc stannate ohmic contact to p-GaN. This chart is a general overview to illustrate the variety of options for forming the contact. The scope encompasses other semiconductors with work functions similar to p-GaN, i.e., >4.2 eV. Step 301 of preparing the substrate may or may not include formation of underlying layers or structures, cleaning, degassing, passivation, or other treatments. The substrate may or may not include GaN or another III-V compound as a bulk material or a film. For example, the substrate may be GaN, or the substrate may be sapphire, silicon, or silicon carbide with or without a GaN layer.

Step 302 of forming one or more p-GaN structure(s) may include providing a p-doped region in a GaN substrate or a deposited GaN layer on a non-GaN substrate. Alternatively, the entire substrate or GaN layer may be p-type. Optionally, step 302 may include patterning the GaN may be patterned to form a 3D structure or texture such as a waveguide or diffraction grating.

Step 303 of forming the zinc stannate TCO layer may be done after step 302 to form a zinc stannate ohmic contact layer may be formed above the p-GaN structure. Optional step 305 of forming intervening layers (e.g., buffer layers, coupling layers, barrier layers, adhesion layers, seed layers, doping layers) may be done before or after zinc stannate formation 303. In some cases (e.g., a very thin adhesion or doping layer) intervening layer formation 305 may occur between zinc stannate formation 303 and p-GaN structure formation 302. Afterward, next process 399 may commence.

Figure 4:
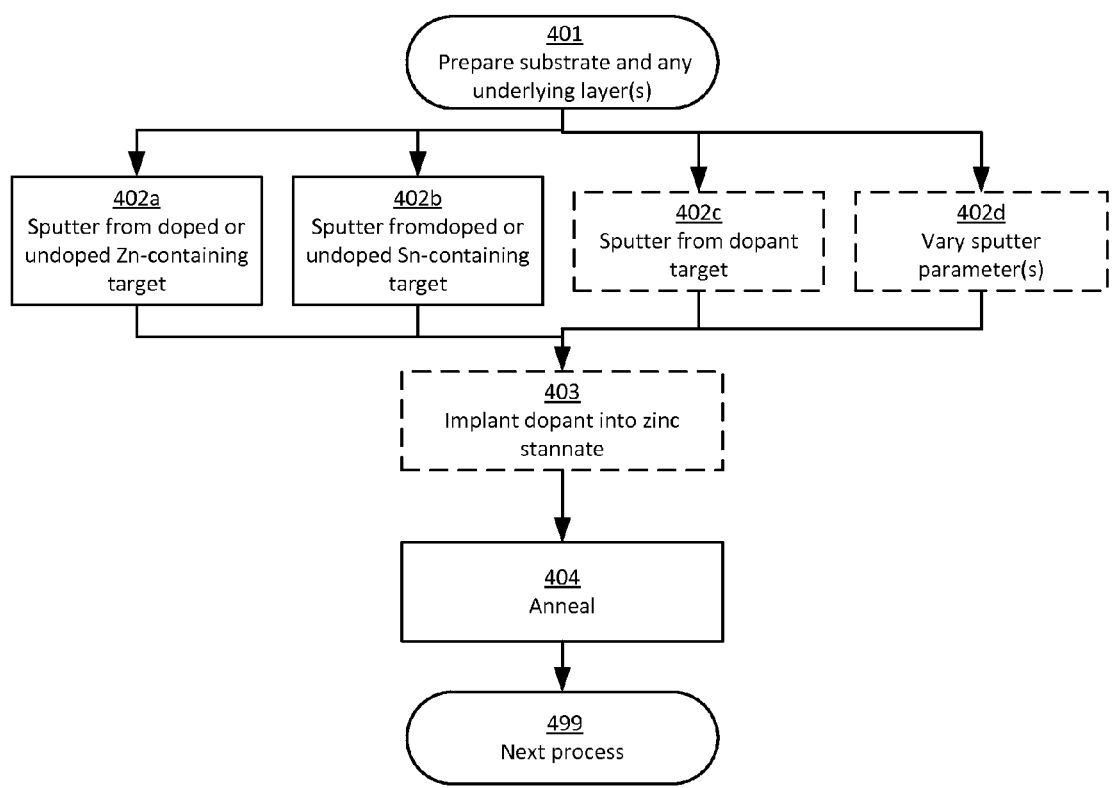
FIG. 4 is a flowchart of an example process for forming a zinc stannate layer by co-sputtering.
Figure 5A:
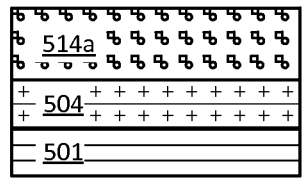
FIGS. 5A-5F illustrate various types of layers created by some process embodiments.
Figure 5B:
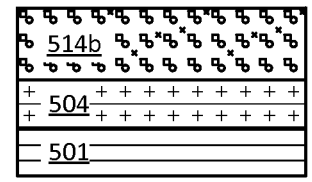
Figure 5C:
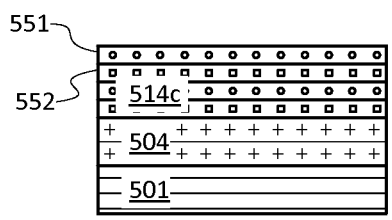
Figure 5D:
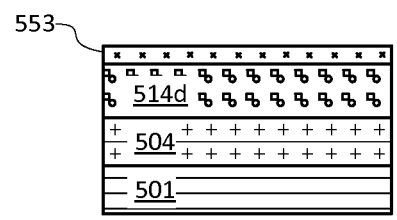
Figure 5E:
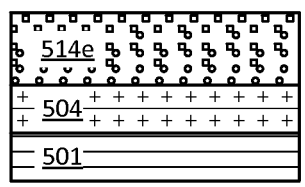
Figure 5F:
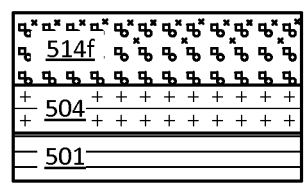

FIG. 4 is a flowchart of an example process for forming a zinc stannate layer by co-sputtering. For example, these processes may be used in step 303 of FIG. 3. Step 401 of preparing the substrate and any underlying layer(s) may include, for example, cleaning and degassing the substrate, forming a p-GaN structure, forming a reflective layer, or forming any other appropriate layers or structures. Deposition of the zinc stannate includes step 402a of sputtering from a zinc-containing target and step 402b of sputtering from a tin-containing target, and may optionally also include step 402c of sputtering a dopant and/or step 402d of varying the sputter parameters.

In steps 402a and 402b, the zinc-containing target may be ZnO and the tin-containing target may be $SnO_2$. When at least one of the zinc-containing or tin-containing targets is an oxide, the gases intentionally injected into the chamber from external gas sources may consist essentially of inert gases such as argon (Ar) and nitrogen ($N_2$). Alternatively, the sputter chamber ambient may include oxygen to oxidize metal sputtered from a metallic zinc target, a metallic tin target, or both. In some embodiments, both the ZnO (or Zn) and the SnO$_2$ (or the Sn) may be sputtered from a single alloyed or composite target.

In optional step 402c, the dopant may be Al or In and may make up 5 wt % or less of the zinc stannate layer. If the dopant is incorporated into one or both of the zinc-containing or tin-containing targets, step 402c is subsumed into step 402a and/or step 402b. Alternatively, the dopant may be sputtered from a separate target or ion-implanted in a separate process.

In optional step 402d the sputter power, the throw-distance from the target to the substrate, the angle of the target relative to the substrate, and other parameters may be varied to manipulate the Zn:Sn ratio in the layer being formed. If the dopant is puttered from a separate target, the dopant concentration may be manipulated as well. In some embodiments, one of these parameters may be varied during the deposition to produce a composition gradient in the zinc stannate layer. In some embodiments, the parameter(s) may be selected to produce a work function greater than 4.2 eV. In some embodiments, the Zn:Sn ratio may be between about 1:2 and 2:1.

Steps 402a-402d of depositing the zinc stannate may be simultaneous. Alternatively, partially simultaneous (i.e. simultaneous for some time although one of the steps may begin before, or end after, another), sequential, or alternating. For example, some sputtering 402a-b may occur, then a parameter change 402d, then more sputtering 402a-b with the changed parameter. Alternatively, the parameter change 402d may be done while sputtering continues. As another example, Zn or ZnO sputtering 402a may alternate with Sn or SnO$_2$ sputtering 402b to form a nanolaminate that interdiffuses during annealing step 404. In a further example, step 402c of depositing a layer of the dopant Al or In may be done before, after, or during a pause in the Zn or ZnO sputtering 402a and the Sn or SnO$_2$ sputtering 402b; then the dopant layer may be diffused into the zinc stannate layer by annealing.

The deposition temperature may be between about 25 C and 500 C. In some embodiments, the zinc stannate may at least partially crystallize during deposition. The sputter power density may be between about 1 and 9 W/cm$^2$ (e.g., 50-400 W on a 7.5-cm diameter target). The deposition may include injecting an oxygen-containing gas (e.g., O$_2$, O$_3$, H$_2$O, NO$_2$) into the chamber, or it may only include injecting inert gases such as Ar or N$_2$.

Optional step 403 of implanting dopant ions into the zinc stannate layer may follow formation of an undoped or partially doped zinc stannate layer in steps 402a-d. If the ion implantation damages the zinc stannate layer, the annealing step 404 may repair the damage.

In step 404 of annealing, the substrate may be heated to a temperature between about 200 C and 650 C (e.g., 300 C). In some embodiments, the zinc stannate may at least partially crystallize during annealing. The annealing may be done at any point after deposition of the zinc stannate; directly after deposition, or after subsequent processes such as the formation of other layers or structures.

FIGS. 5A-5F illustrate various types of layers created by some process embodiments. The zinc stannate layers 514a-f, as illustrated, are above p-GaN layer 504 on substrate 501. In some embodiments, zinc stannate layers 514a-f may be between about 20 nm and 200 nm thick, e.g., about 100 nm thick. Substrate 501 may also include underlying layers and structures. Layer 514a is a zinc stannate layer, e.g., ZnSnO$_3$. Layer 514b is a zinc stannate layer, e.g., ZnSnO$_3$, with a dopant (e.g., Al or In, symbolized by the small "x" marks,) dispersed throughout the layer, as when co-deposited or diffused by annealing.

Layer 514c is a nanolaminate of ZnO layers 551 and SnO$_2$ layers 552, which may be stacked in any order. The nanolaminate may later be interdiffused by annealing to a layer more similar to 514a. Layer 514d is a zinc stannate layer with a layer 553 of separately deposited dopant (e.g., Al or In). Dopant layer 553 is illustrated above zinc stannate layer 514d, but may alternatively be underneath or inside layer 514d. Dopant layer 553 may later be interdiffused by annealing to form a layer more similar to 514b.

Layer 514e is a zinc stannate layer with a depth-wise gradient of the Zn:Sn ratio. As illustrated, the layer is predominantly zinc oxide at the bottom and tin oxide on top, but some embodiments may have an opposite gradient. Layer 514f is a zinc stannate layer with a depth-wise gradient of a dopant (e.g., Al or In). As illustrated, the dopant is predominantly concentrated at the top of the layer, but some embodiments may predominantly concentrate the dopant at the bottom or somewhere between the top and the bottom.

These examples are not intended to be limiting. Layers with combinations of characteristics from different examples are also within the scope (e.g., a nanolaminate as in FIG. 5C in which one or more of the layers are dopant layers 553 from FIG. 5D, or a gradient layer as in FIG. 5E or 5F formed by constructing a nanolaminate with varying thicknesses or distributions of layers 551, 552 and/or 553).

Figure 6:
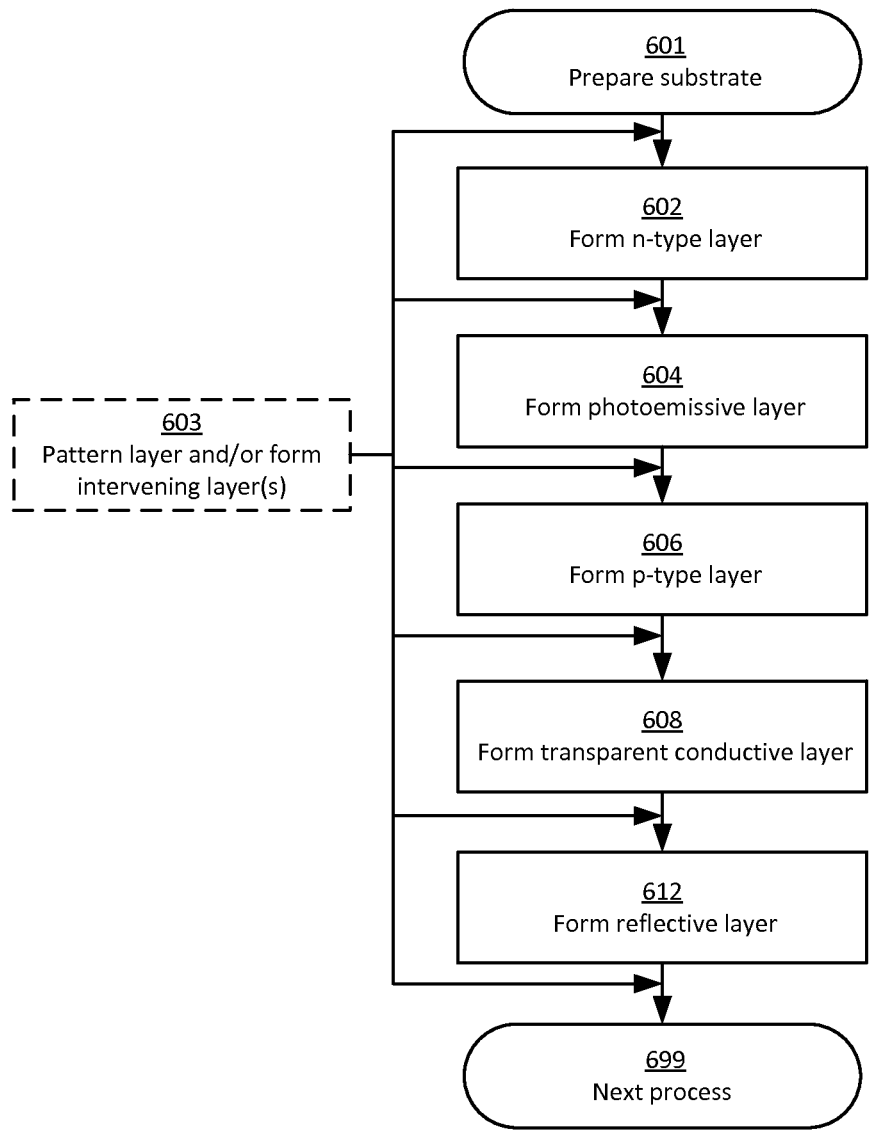
FIG. 6 is a flowchart of an example process for fabricating an LED stack.

FIG. 6 is a flowchart of an example process for fabricating an LED stack. Step 601 of preparing the substrate may include cleaning, degassing, other treatments, or formation of underlying layers or structures. Steps 602-604 form the active stack: Step 602 of forming an n-type layer, step 604 of forming the photoemissive layer, and step 606 of forming a p-type layer may be done in any order, provided that the photoemissive layer is between the n-type layer and the p-type layer. Step 608 of forming a transparent conductive layer may follow active stack formation 602-604. Step 612 of forming a reflective layer may include forming a reflective layer on the other side of the substrate such as 112A in FIG. 1A. Optional step 603 of patterning a formed layer and/or forming one or more intervening layers (e.g., buffer layers, barrier layers, seed or nucleation layers, doping layers, adhesion layers) may be done at any point before the next process 699 commences.

In some embodiments, p-type layer formation 606 may include forming a p-GaN layer, and transparent conductive layer formation 608 may include forming a zinc stannate layer by one of the methods discussed with reference to FIG. 4.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A device, comprising:
   a semiconductor layer having a work function greater than or equal to 4.2 eV; and
   a conductive layer adjacent to the semiconductor layer;
   wherein the conductive layer comprises zinc, tin, and oxygen;
   wherein a weight ratio of zinc to tin in the conductive layer is between about 1:2 and about 2:1; and
   wherein the conductive layer is operable as an ohmic contact to the semiconductor layer.

2. The device of claim 1, wherein the semiconductor layer comprises p-GaN.

3. The device of claim 1, wherein a thickness of the conductive layer is between about 20 nm and about 200 nm.

4. The device of claim 1, wherein a thickness of the conductive layer is between about 100 nm.

5. The device of claim 1, wherein a work function of the conductive layer is greater than about 5 eV.

6. The device of claim 1, wherein the conductive layer further comprises a dopant.

7. The device of claim 6, wherein a weight percentage of the dopant in the conductive layer is less than or equal to about 5%.

8. The device of claim 7, wherein the dopant comprises aluminum or indium.

9. The device of claim 1, wherein the conductive layer is at least 30% crystalline.

10. The device of claim 1, wherein the conductive layer has absorption coefficient below 0.03%/nm for wavelengths between about 400 nm and about 800 nm.

* * * * *